United States Patent
Kitagawa

(10) Patent No.: US 7,218,496 B2
(45) Date of Patent: May 15, 2007

(54) OVERCURRENT PROTECTION CIRCUIT

(75) Inventor: Atsushi Kitagawa, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 11/181,274

(22) Filed: Jul. 14, 2005

(65) Prior Publication Data
US 2006/0012932 A1    Jan. 19, 2006

(30) Foreign Application Priority Data
Jul. 15, 2004   (JP) ............................. 2004-209109
Jun. 10, 2005   (JP) ............................. 2005-171174

(51) Int. Cl.
*H02H 9/08* (2006.01)

(52) U.S. Cl. .................. 361/93.9; 361/93.1; 361/93.5; 361/93.7; 361/96; 361/97

(58) Field of Classification Search .............. 361/93.1, 361/93.5, 93.7, 96, 97
See application file for complete search history.

(56) References Cited
U.S. PATENT DOCUMENTS
4,428,015 A * 1/1984 Nesler ..................... 361/18
4,476,427 A * 10/1984 Kaneko et al. ............. 323/234
4,698,712 A * 10/1987 Fritsch ....................... 360/128
5,621,601 A * 4/1997 Fujihira et al. ............. 361/93.9
5,739,712 A * 4/1998 Fujii ........................... 327/323
5,859,757 A * 1/1999 Hanafusa et al. ............ 361/100
5,943,204 A * 8/1999 Jones et al. ................. 361/93.2

FOREIGN PATENT DOCUMENTS
JP    05-315852    11/1993

* cited by examiner

*Primary Examiner*—Stephen W. Jackson
*Assistant Examiner*—Terrence Willoughby
(74) *Attorney, Agent, or Firm*—Cantor Colburn LLP

(57) ABSTRACT

The voltage generator circuit includes a regulator, a first sensor circuit, and a second sensor circuit. The first sensor circuit includes a first transistor, a first resistor, and an error amplifier. When V1>Vth, the error amplifier senses an overcurrent condition to provide feedback to the operational amplifier to limit an output current. The second sensor circuit includes a second transistor, a second resistor, and a sensing transistor. When the output current exceeds a sense threshold current, the sensing transistor is turned ON to provide feedback to the operational amplifier 12 to limit the output current. The second sensor circuit has a higher setting of sense threshold current than does the first sensor circuit, while having a higher setting of sensing speed than does the first sensor circuit.

9 Claims, 4 Drawing Sheets

300

OVERCURRENT PROTECTION CIRCUIT

BACKGROUND OF THE INVENTION

1. Field of the Invention

The present invention relates to an overcurrent protection circuit, and more particularly to a circuit protection technique for protecting a voltage generator circuit used as a power supply circuit from overcurrents.

2. Description of the Related Art

In regulators for stabilizing voltages or the like, used as an output transistor is the power MOSFET (Metal Oxide Semiconductor Field Effect Transistor), the IGBT (Insulated Gate Bipolar Transistor), the bipolar power transistor or the like. These transistors are designed to have a sufficient margin between the maximum allowable current and a current flowing during normal operation.

However, even with the transistor designed to have such a sufficient design margin, a short circuit may be developed in the output load circuit. In this case, there was a problem that a large overcurrent exceeding the maximum allowable current would flow through the transistor, thereby affecting the reliability thereof. Furthermore, even when the overcurrent was equal to or below the maximum allowable current of the transistor, it was desired, in some cases, to limit current in order to protect the load circuit connected to the transistor.

In this context, it was a conventional practice to provide the regulator with a protection circuit having a current limiting function in order to protect the transistor from overcurrents or limit the current flowing through the load circuit (see, for example, Japanese Patent Laid-Open Publication No. Hei 5-315852).

However, as pointed out in the aforementioned document, the protection circuit having the current limiting function for sensing the current flowing through the transistor for feedback raised a problem of having adverse effects on the stability of the circuit. That is, a wider frequency band of a feedback loop to improve the capability of tracking variations in output current would introduce instability to the circuit, thereby causing the circuit to readily oscillate. In contrast to this, to assign a higher priority to the stability of the circuit, the gain of the feedback loop and the frequency band could be reduced to make the circuit resistant to oscillation. In this case, however, there raised a problem of being unable to track a sudden change in output current and requiring a long time before the current was actually limited, during which a large current flow would result. That is, the protection circuit having the current limiting function can be said to have a trade-off relation between the stability of the circuit and its sensing speed.

SUMMARY OF THE INVENTION

The present invention was developed in view of the aforementioned problems. It is therefore an object of the present invention to provide an overcurrent protection circuit which is capable of quickly sensing an overcurrent for current limiting without loss of stability of the circuit. It is another object of the invention to provide a voltage generator circuit which employs the overcurrent protection circuit.

To address the aforementioned problems, an overcurrent protection circuit according to an aspect of the present invention comprises first and second sensor circuits which sense that a voltage generator circuit is in an overcurrent condition by monitoring a current corresponding to an output current from the voltage generator circuit, thereby limiting the output current. In the overcurrent protection circuit, the second sensor circuit is set to a higher sensing speed than the first sensor circuit, and the second sensor circuit is set to a larger overcurrent sense threshold current than the first sensor circuit.

According to this aspect, when the output current suddenly increases at a speed at which the first sensor circuit designed to have a higher priority on its stability cannot track it, current limiting is accomplished by the second sensor circuit provided with a higher priority on its operating speed rather than on its stability. Then, after the output current has become lower than the sense threshold current for the second sensor circuit, only the first sensor circuit performs the current limiting operation. As a result, control is switched over to the first sensor circuit for current limiting before the second sensor circuit becomes so unstable as to oscillate, or even after the oscillation has started, control is switched over in a very short period of time to the first sensor circuit for current limiting. It is thus possible to limit a sudden increase in output current without loss of stability of the circuit.

At least one of the sense threshold currents for the first and second sensor circuits may be set to a low value when the output voltage of the voltage generator circuit is low. When the output voltage is low, i.e., when the load circuit is short-circuited, the output current limit can be set to a low value. This allows for obtaining a so-called fold-back drooping characteristic in the output current versus output voltage characteristics, thereby preferably suppressing heat generation in the circuit.

The first and second sensor circuits, each connected in parallel to the voltage generator circuit, may allow a current corresponding to the output current to flow through a resistor having a fixed potential at one end for conversion into a voltage, which is in turn compared with a voltage corresponding to their respective sense threshold currents to thereby sense an overcurrent condition. The first sensor circuit may compare the voltages using a voltage comparator to thereby provide feedback to limit the output current. The second sensor circuit may supply the resulting voltage across the resistor to a control terminal of a sensing transistor to sense the overcurrent condition corresponding to an ON or OFF operation of the sensing transistor, then providing feedback to limit the output current by means of a current flowing when the sensing transistor is turned ON.

As used herein, the "control terminal of the transistor" shall refer to a terminal for controlling the ON or OFF of the transistor, i.e., the gate terminal of the FET or the base terminal of the bipolar transistor.

Another aspect of the present invention provides a voltage generator circuit. The voltage generator circuit comprises: a regulator circuit made up of an output transistor and an operational amplifier which controls the output transistor; and first and second sensor circuits. The first sensor circuit includes: a first transistor arranged in parallel to the output transistor; a first resistor, provided on a current path of the first transistor, with a fixed voltage at one end; and an error amplifier which compares a voltage appearing at the other end of the first resistor with a voltage corresponding to a first sense threshold current to provide feedback to limit the output current to the operational amplifier when the voltage appearing across the first resistor is higher. The second sensor circuit includes: a second transistor arranged in parallel to the output transistor; a second resistor, provided on a current path of the second transistor, with a fixed voltage at one end; and a sensing transistor which receives at a control terminal thereof the voltage appearing at the other end of the second resistor to sense an overcurrent condition corresponding to its ON or OFF, then providing feedback to limit the output current to the operational amplifier when the overcurrent condition has been sensed. The sense threshold current for the second sensor circuit is set to a higher value than the first sensor circuit.

According to this aspect, the two sensor circuits, i.e., the fast second sensor circuit and the stable first sensor circuit detect an overcurrent condition of the output transistor in the regulator circuit and provide feedback for current limiting. This allows high-speed detection and operation limiting without loss of stability of the circuit.

The first sensor circuit may also include a third resistor which is provided between the one end of the first resistor having a fixed potential and the ground potential, and a switch transistor which bypasses the third resistor. The output voltage from the voltage generator circuit may be applied to the control terminal of the switch transistor.

When the switch transistor is ON, i.e., when the output voltage is higher than a gate threshold voltage, the third resistor is bypassed, thereby allowing a current to voltage conversion only through the first resistor. Conversely, since the switch transistor is turned OFF when the output voltage is lower than the gate threshold voltage of the switch transistor, the first resistor and the third resistor are directly connected to each other for current-to-voltage conversion. According to this aspect, the sense threshold current is substantially adjusted in response to the output voltage. Accordingly, when the output voltage is low, i.e., when the load circuit is short-circuited, the output current limit can be set to a low value. This allows for obtaining a so-called fold-back drooping characteristic in the output current versus output voltage characteristics, thereby preferably suppressing heat generation in the circuit.

Likewise, the second sensor circuit may also include a fourth resistor which is provided between the one end of the second resistor having a fixed potential and the ground potential, and a switch transistor which bypasses the fourth resistor. Furthermore, the output voltage from the voltage generator circuit may also be applied to the control terminal of the switch transistor.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
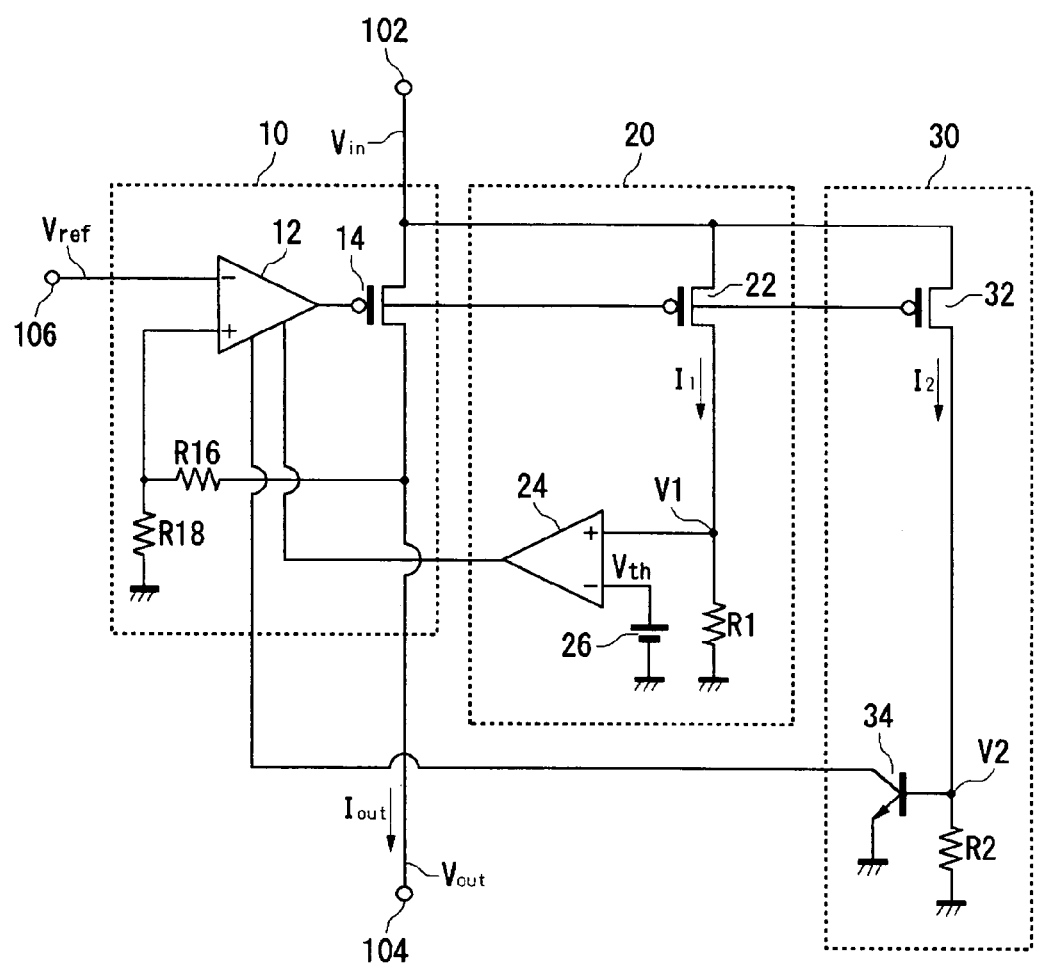
FIG. 1 is a circuit diagram showing a voltage generator circuit according to an embodiment of the present invention.

FIG. 1 is a circuit diagram showing a voltage generator circuit 100 according to an embodiment of the present invention. The voltage generator circuit 100 is a three-terminal voltage regulator for adjusting an output voltage to a constant value based on a reference voltage and includes an overcurrent protection circuit.

Figure 4:
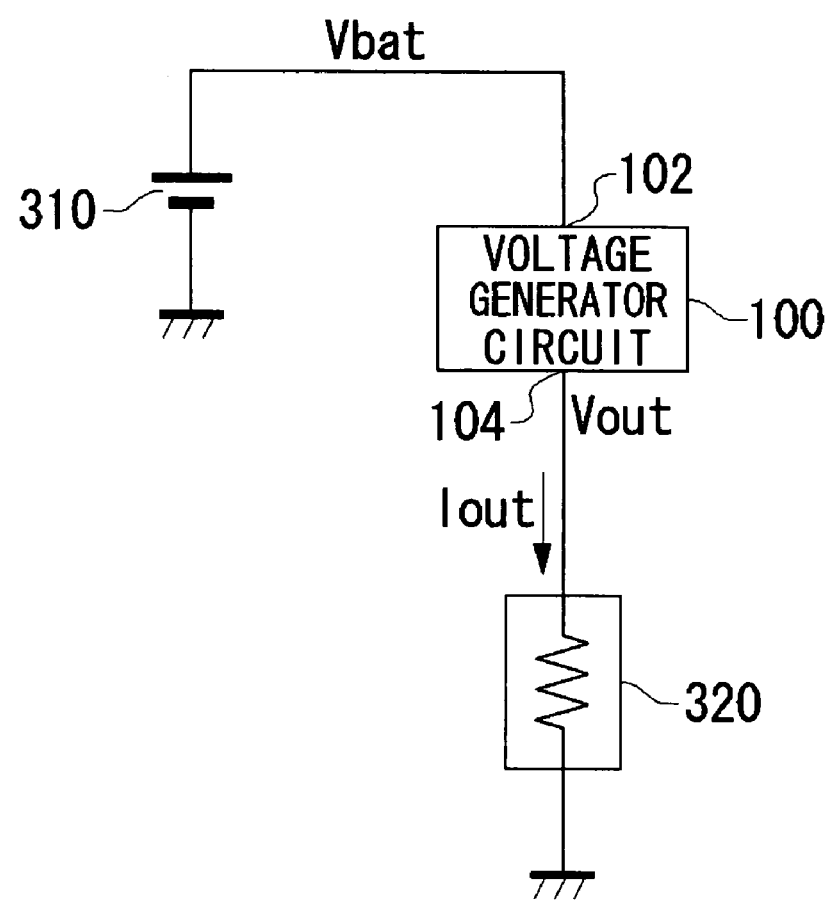
FIG. 4 is a block diagram showing the arrangement of an electronic apparatus which incorporates the voltage generator circuit of FIG. 1.

FIG. 4 is a block diagram showing the arrangement of an electronic apparatus 300 which incorporates the voltage generator circuit 100 of FIG. 1. For example, the electronic apparatus 300 may be a cellular phone, a PDA (Personal Digital Assistance), a digital still camera, or a CD player. The electronic apparatus 300 includes a battery 310, the voltage generator circuit 100, and a load 320. For example, the battery 310, which may be a lithium-ion battery, delivers a battery voltage Vbat of about 3 to 4V. The battery voltage Vbat is supplied to an input terminal 102 of the voltage generator circuit 100. The voltage generator circuit 100 steps the supplied battery voltage Vbat down to a predetermined target voltage to deliver an output voltage Vout from an output terminal 104. The output terminal 104 of the voltage generator circuit 100 is connected with the load 320. The load 320 is one of various types of circuits which requires a stabilized voltage; the electronic apparatus 300 is provided as the load, e.g., with a CPU, an LED, a motor, or an oscillator. An output current Iout from the voltage generator circuit 100 will flow through the load 320.

Now, referring back to FIG. 1, the voltage generator circuit 100 has three terminals: the input terminal 102, the output terminal 104, and a reference voltage terminal 106. Those voltages which are applied to or appear at the respective terminals are referred to as an input voltage Vin, the output voltage Vout, and a reference voltage Vref, respectively. The input voltage Vin is the battery voltage Vbat of FIG. 4.

The voltage generator circuit 100 includes a regulator 10, a first sensor circuit 20, and a second sensor circuit 30.

The regulator 10 is a typical three-terminal regulator which includes an output transistor 14, an operational amplifier 12, and resistors R16 and R18. The regulator 10 maintains the output voltage Vout from the output terminal 104 at a constant value in accordance with the reference voltage Vref applied to the reference voltage terminal 106. The output terminal 104 is connected with a load circuit (not shown).

The inverting input terminal of the operational amplifier 12 is supplied with the reference voltage Vref. The non-inverting input terminal is supplied as feedback with the output voltage Vout which has been divided by the resistors R16 and R18 and multiplied by R18/(R16+R18). The output of the operational amplifier 12 is supplied to the gate terminal of the output transistor 14.

The output transistor 14, which is a P-channel MOSFET, has its source terminal serving as the input terminal 102 of the voltage generator circuit 100 and its drain terminal serving as the output terminal 104 of the voltage generator circuit 100.

In the regulator 10, the operational amplifier 12 adjusts the gate voltage of the output transistor 14 so that the voltages applied to the non-inverting input terminal and the inverting input terminal become equal. Accordingly, the output voltage Vout is stabilized so that Vout=Vref×(R16+R18)/R18. The current flowing through the load circuit via the output transistor 14 is referred to as the output current Iout.

The first sensor circuit 20 includes a P-channel MOSFET or a first transistor 22, a first resistor R1, an error amplifier 24, and a constant-voltage source 26. The first transistor 22, which is arranged in parallel to the output transistor 14 of the regulator 10 to have a common gate voltage and a common source voltage, has a current capacity lower than that of the output transistor 14. Accordingly, a current I1 flows through the first transistor 22 corresponding to the output current Iout. The current I1 flowing through the first transistor 22 depends on the transistor size ratio between the output transistor 14 and the first transistor 22. Assuming that the size ratio between the first transistor 22 and the output transistor 14 is M1, it holds between the current I1 and the output current Iout such that Iout=M1×I1.

The first resistor R1 is arranged between the drain terminal of the first transistor 22 and the ground potential terminal to convert the current I1 into a voltage. That is, a current corresponding to the output current Iout flowing through the output transistor 14 is converted into a first sensed voltage V1 appearing across the first resistor R1, and it holds that V1=I1×R1=Iout/M1×R1.

The constant-voltage source 26 generates a sense threshold voltage Vth. The sense threshold voltage Vth, which is to be compared with the first sensed voltage V1, corresponds with a voltage for determining an output current corresponding to a sense threshold current in the first sensor circuit 20 (hereinafter referred to as a sense threshold current Ith1). That is, the sense threshold voltage Vth is determined using the sense threshold current Ith1 in accordance with the relation, Vth=Ith1/M1×R1.

The error amplifier 24 is supplied with the first sensed voltage V1 and the sense threshold voltage Vth generated by the constant-voltage source 26. The error amplifier 24 compares the first sensed voltage V1 corresponding to the output current Iout with the sense threshold voltage Vth corresponding to the sense threshold current Ith1 in the first sensor circuit 20. If V1>Vth, the error amplifier 24 determines the presence of an overcurrent condition and then provides feedback to the operational amplifier 12 to limit the output current. That is, the first sensor circuit 20 compares the output current Iout with the sense threshold current Ith1, thereby sensing a short-circuited condition of the load circuit.

To reduce the output current Iout from the output transistor 14, the gate terminal voltage of the output transistor 14 may be increased close to the input voltage Vin. In the case of a typical operational amplifier made up of a differential input stage, an amplification stage, and an output stage, the output from the error amplifier 24 may be connected to the amplification stage of the operational amplifier 12 to forcedly change the gate voltage of the output transistor 14 under an overcurrent condition, thereby performing current limiting.

The first sensor circuit 20 configured as described above forms a feedback loop from the output of the voltage generator circuit 100 to the operational amplifier 12. Accordingly, the error amplifier 24 is provided with a reduced feedback loop gain and a setting of narrowed frequency band in order to ensure a sufficient phase margin and enhance the stability of the circuit. Since the error amplifier 24 needs not to provide a fast response, it is made possible to readily reduce current consumption in the error amplifier 24 and thus extend the duration of operation of a battery-powered apparatus.

The second sensor circuit 30 includes a P-channel MOSFET or a second transistor 32, a second resistor R2, and a sensing transistor 34. Like the first transistor 22, the second transistor 32 is also arranged in parallel to the output transistor 14 of the regulator 10 to have a common gate voltage and a common source voltage. Accordingly, a current I2 corresponding to the output current Iout flows through the second transistor 32. Assuming that the size ratio between the second transistor 32 and the output transistor 14 is M2, it holds between the current I2 and the output current Iout such that Iout=M2×I2.

The second resistor R2 is arranged between the drain terminal of the second transistor 32 and the ground potential terminal to convert the current I2 into a voltage. That is, the output current Iout flowing through the output transistor 14 is also converted into a second sensed voltage V2 appearing across the second resistor R2, and it holds that V2=I2×R2=Iout/M2×R2.

The sensing transistor 34, which is an NPN bipolar transistor, has its base terminal that receives the second sensed voltage V2. In the second sensor circuit 30, the sensing transistor 34 compares the second sensed voltage V2 obtained through a current-to-voltage conversion of the output current Iout with a base-emitter diode forward voltage Vf in order to determine an overcurrent condition depending on the sensing transistor 34 being turned ON or OFF. A typical silicon process provides a value of about 0.7V to the forward voltage Vf.

As described above, the overcurrent condition is determined to be present when it holds that V2=Iout/M2×R2 and the second sensed voltage V2 has exceeded the forward voltage Vf. The output current appearing at the time of the condition being inverted is assumed to be Ith2. The second sensor circuit 30 compares the output current Iout with the sense threshold current Ith2 given by Ith2=M2/R2×Vf, thereby sensing a short-circuit condition of the load circuit.

In an overcurrent condition, i.e., if Iout>Ith2, then V2>Vf and thus the sensing transistor 34 is turned ON. As in the first sensor circuit 20, the collector terminal of the sensing transistor 34 may be connected to the amplification stage of the operational amplifier 12. At this time, when the sensing transistor 34 is turned ON in an overcurrent condition, the sensing transistor 34 pulls the collector current from the amplification stage of the operational amplifier 12. Accordingly, its voltage can be forcedly changed to limit the output current Iout.

The second sensor circuit 30 configured as described above includes the sensing transistor 34 to have a fast response speed and thus a wide frequency band. The sense threshold current Ith2 in the second sensor circuit 30 is defined in relation to the sense threshold current Ith1 in the first sensor circuit 20, so that it holds that Ith2>Ith1.

Figure 2A:
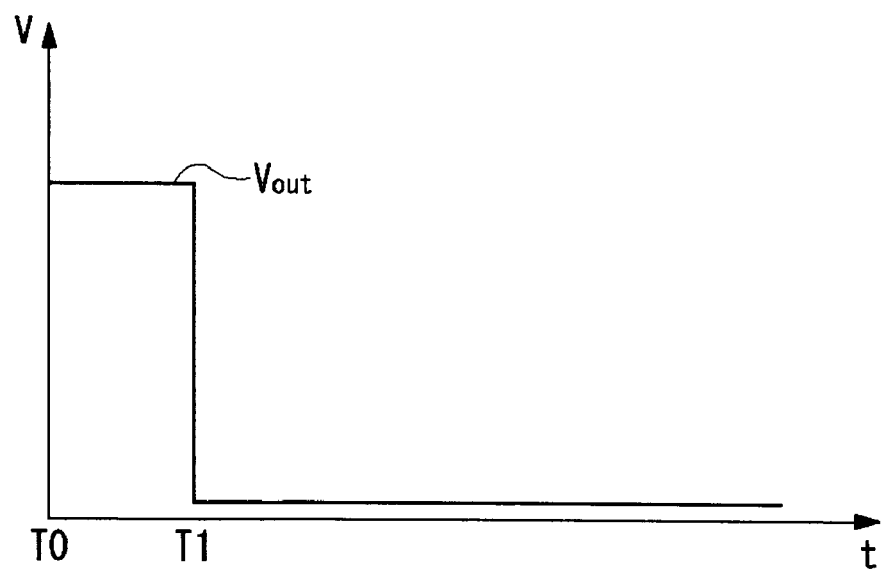
FIGS. 2A and 2B are views showing a voltage versus time curve and a current versus time curve, respectively, when a load circuit connected to the voltage generator circuit of FIG. 1 is short-circuited.
Figure 2B:
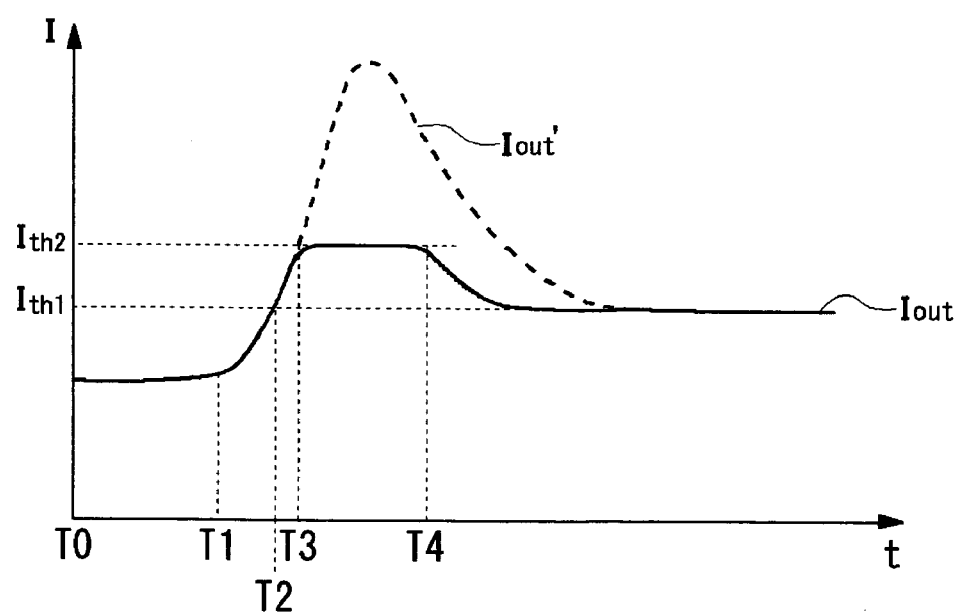

Now, an explanation will be given to the operation of the voltage generator circuit 100, configured as described above, with reference to FIGS. 2A and 2B. FIGS. 2A and 2B show a voltage versus time curve and a current versus time curve, respectively, when the load circuit connected to the voltage generator circuit 100 is short-circuited. Assume that from time T0 to T1, the circuit performs a normal operation, and the load circuit is short-circuited at time T1. First, the explanation is directed to the case where only the first sensor circuit 20 is operated.

As shown in FIG. 2A, when the load circuit is short-circuited at time T1, the output voltage Vout drops close to 0V. Since Iout<Ith1 at this point in time, the first sensor circuit 20 performs no operation for current limiting, while the regulator 10 attempts to produce the output voltage Vout in accordance with the reference voltage Vref. Consequently, as shown in FIG. 2B, the output current Iout from the output transistor 14 suddenly increases.

When the output current Iout reaches the sense threshold current Ith1 for the first sensor circuit 20 at time T2, the error amplifier 24 starts current limiting. That is, the error amplifier 24 provides feedback to the operational amplifier 12, attempting to increase the gate voltage of the output transistor 14 to reduce the output current Iout. However, since the frequency band of the feedback loop of the first sensor circuit 20 including the error amplifier 24 is designed to be narrow to ensure stability, the response speed of the first sensor circuit 20 is not fast enough to track the increase in the output current Iout. Accordingly, as shown with a broken line in FIG. 2B, the output current Iout' continues to increase in the first sensor circuit 20 even after V1>Vth1, i.e., Iout>Ith1. Thereafter, the feedback from the error amplifier 24 controls the operational amplifier 12, such that the output current Iout' from the output transistor 14 gradually decreases close to the sense threshold current Ith1.

As can be seen from the foregoing, when only the first sensor circuit 20 is used for current limiting, its limited sensing speed causes the output current Iout to increase even after the sense threshold current Ith1 has been exceeded resulting in a large current flowing. Accordingly, this arrangement will not sufficiently protect the circuit.

On the other hand, when only the second sensor circuit 30 is used for current limiting, a wide bandwidth of the sensing transistor 34 ensures a sufficiently fast sensing speed. When the output current Iout exceeds the sense threshold current Ith2, feedback is immediately provided to reduce the output current Iout. However, in some cases, since a phase margin was not sufficiently ensured, the circuit would become unstable leading to an oscillation.

Now, an explanation will be given to the case where the first sensor circuit 20 and the second sensor circuit 30 are used in combination for operation. The curve of the output current Iout provided then is shown with a solid line in FIG. 2B.

When the load circuit is short-circuited at time T1, the output voltage Vout sharply decreases, whereas the output current Iout starts to sharply increase. When Iout>Ith1 at time T2, the first sensor circuit 20 senses an overcurrent condition and then provides feedback to the operational amplifier 12 so as to decrease the output current Iout. However, since the sensing speed of the first sensor circuit 20 is low as described above, the output current Iout continues to increase.

When the output current Iout further increases to the sense threshold current Ith2 of the second sensor circuit 30 at time T3, the sensing transistor 34 is turned ON to provide feedback to the operational amplifier 12 so as to limit the output current Iout. Since the sensing speed of the second sensor circuit 30 is fast enough to track the change in the output current Iout, the output current Iout is immediately limited to the Ith2. Thereafter, at time T4, the first sensor circuit 20 having a low sensing speed starts to provide feedback. Thus, the output current Iout starts to gradually decrease so as to approach the sense threshold current Ith1 of the first sensor circuit 20. Compared with the case in which only the first sensor circuit 20 is employed, this allows for limiting the output current Iout more quickly without increasing the output current Iout. Furthermore, if the output current Iout becomes less than the sense threshold current Ith2 for the second sensor circuit 30, then V2<Vf and the sensing transistor 34 of the second sensor circuit 30 is turned OFF to interrupt the feedback path. This eliminates the instability of the circuit.

As described above, the voltage generator circuit 100 according to this embodiment can accomplish current limiting in response to a sudden change in the output current Iout without loss of stability of the circuit. That is, when the output current Iout suddenly increases at a speed at which the first sensor circuit 20 designed with a higher priority on its stability cannot track it, the second sensor circuit 30 designed with a higher priority on its operating speed performs current limiting. Then, after the output current Iout becomes less than the sense threshold current Ith2 for the second sensor circuit 30, only the first sensor circuit 20 performs current limiting.

As a result, control is switched over only for the first sensor circuit 20 to perform current limiting even when the feedback path in the second sensor circuit 30 makes the circuit unstable. This makes it possible to limit a sudden increase in output current Iout without loss of stability of the circuit.

Figure 3:
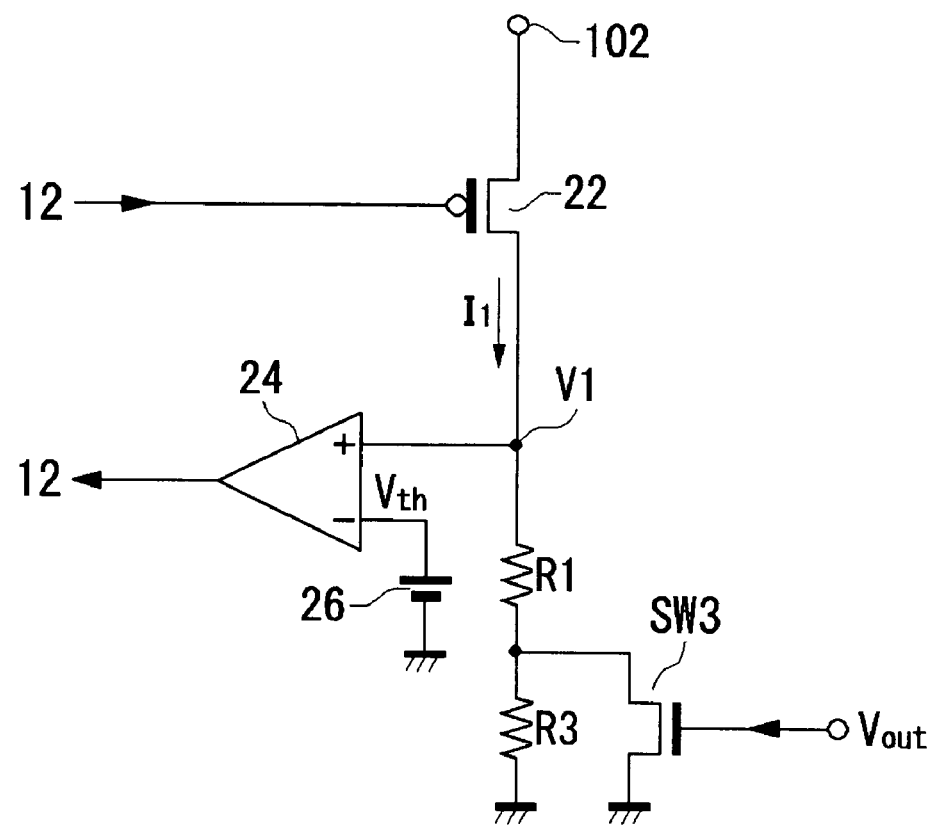
FIG. 3 is a circuit diagram showing an arrangement in a first sensor circuit for providing a setting of sense threshold current corresponding to an output voltage.

Furthermore, in this embodiment, the sense threshold currents Ith1 and Ith2 for the first sensor circuit 20 and the second sensor circuit 30 may also be varied with a voltage corresponding to the output voltage Vout. FIG. 3 is a circuit diagram showing an arrangement for providing a setting of sense threshold current Ith1 corresponding to the output voltage Vout in the first sensor circuit 20. The first sensor circuit 20 shown in FIG. 3 includes a third resistor R3 and an N-channel MOSFET or a switch transistor SW3 in addition to the components of the first sensor circuit 20 shown in FIG. 1.

The third resistor R3 is provided in series with the first resistor R1, while the switch transistor SW3 is arranged in parallel to the third resistor R3.

When the output voltage Vout is higher than the gate threshold voltage Vt of the switch transistor SW3, the switch transistor SW3 is turned ON to bypass the third resistor R3. Accordingly, only the first resistor R1 is used for current to voltage conversion. Therefore, the first sensed voltage V1 is given by V1=I1×R1=Iout/M1×R1.

Conversely, when the output voltage Vout is lower than the gate threshold voltage of the switch transistor SW3, the switch transistor SW3 is turned OFF. This causes the first resistor R1 and the third resistor R3 to be connected in series for current-to-voltage conversion. At this time, the first sensed voltage V1 is given by V1=I1×R1=Iout/M1×(R1+R3). This means that in the ON state of the switch transistor SW3, the sense threshold current Ith1 is set to Ith1=Vth×M1/R1, whereas in the OFF state of the switch transistor SW3, the sense threshold current Ith1 is set so that Ith1=Vth×M1/(R1+R3), i.e., to a lower value than in the ON state.

For example, suppose that the gate threshold voltage Vt of an N-channel MOSFET used for the switch transistor SW3 is 1V. In this case, when Vout<1V, the sense threshold current Ith1 is set to a low value. When the load circuit is short-circuited with Vout<1V, the current of the output transistor 14 can be limited to a lower value. This makes it possible to reduce unnecessary current consumption during normal operation and limit the output current Iout to a low value during a short circuit, thereby preferably suppressing heat generation in the output transistor 14. The second resistor R2 in the second sensor circuit 30 may also be configured in the same manner. On the other hand, instead of the output voltage Vout, control can be provided to turn ON or OFF the switch transistor SW3 in accordance with a voltage obtained by dividing the output voltage Vout.

It will be understood by those skilled in the art that the foregoing embodiments are given for illustration purpose only, and various modifications of combinations of the respective components and the respective processes may be made thereto. All such modifications are also intended to fall within the scope of the present invention.

In this embodiment, the operation of the overcurrent protection circuit has been described in accordance with an example in which a load circuit connected to the output terminal is short-circuited. However, the overcurrent protection circuit also effectively functions even when the load circuit is not short-circuited. For example, with a capacitor connected as a load circuit or in parallel to the load circuit, the capacitor needs to be charged in raising the output voltage Vout. At this time, a sudden rise in the output voltage Vout would cause an in-rush current to flow into the capacitor. In some cases, the in-rush current would possibly have an adverse effect on the reliability of the capacitor provided or other circuit components. Even in such a case, the overcurrent protection circuit according to the embodiment can reduce the output current Iout below the sense threshold currents Ith1 and Ith2 by means of the first sensor circuit 20 and the second sensor circuit 30.

In this embodiment, such a case has been described where the overcurrent protection circuit is applied to a three-terminal linear regulator; however, the invention is not limited thereto. For example, the overcurrent protection circuit is also applicable to a step-up circuit with a regulating function. In this case, having sensed an overcurrent condition, the first and second sensor circuits may provide feedback to a PWM control circuit for current limiting. That is, the overcurrent protection circuit according to the present invention is applicable to any output current limiting applications.

This embodiment has been explained in accordance with an example of a MOSFET serving as the output transistor 14, the first transistor 22, and second transistor 32. However, it is also acceptable to employ other types of transistors such as bipolar transistors. The types of transistors may be selected depending on the design specification required for the voltage generator circuit or the semiconductor manufacturing process to be employed. On the other hand, the sensing transistor 34 may also be replaced by a MOSFET transistor.

In this embodiment, all the components included in the voltage generator circuit 100 may be integrated into one piece, or alternatively part thereof may be formed as a discrete component. It may be determined from costs and occupied areas which parts to be integrated into one piece.

In the embodiment, such a case has been explained where the voltage generator circuit 100 is incorporated into the battery-powered electronic apparatus 300. However, the invention is not limited thereto. For example, instead of the battery 310, a power supply such as an AC/DC converter or a DC/DC converter may be connected to the input terminal 102 of the voltage generator circuit 100 to stabilize the voltage delivered from the power supply. Accordingly, the voltage generator circuit 100 according to the embodiment is widely applicable to a variety of applications, such as automobiles or household electric appliances, which need overcurrent protection.

While the preferred embodiments of the present invention have been described using specific terms, such description is for illustrative purposes only, and it is to be understood that changes and variations may be made without departing from the spirit or scope of the appended claims.

What is claimed is:

1. An overcurrent protection circuit comprising:
    a first sensor circuit which senses that a voltage generator circuit is in an overcurrent condition by monitoring a current corresponding to an output current from the voltage generator circuit, thereby limiting the output current; and
    a second sensor circuit which senses that the voltage generator circuit is in an overcurrent condition by monitoring a current corresponding to the output current from the voltage generator circuit, thereby limiting the output current, and wherein
    the second sensor circuit is set to a higher sensing speed than the first sensor circuit, and the second sensor circuit is set to a larger overcurrent sense threshold current than the first sensor circuit.

2. The overcurrent protection circuit according to claim 1, wherein
    at least one of the sense threshold currents for the first and second sensor circuits is set to a low value when the output voltage of the voltage generator circuit is low.

3. The overcurrent protection circuit according to claim 1, wherein
    the first and second sensor circuit, each connected in parallel to the voltage generator circuit, allow a current corresponding to the output current to flow through a, resistor having a fixed potential at one end for conversion into a voltage, which is in turn compared with a voltage corresponding to their respective sense threshold currents to thereby sense an overcurrent condition;
    the first sensor circuit compares the voltages using a voltage comparator to thereby provide feedback to limit the output current; and
    the second sensor circuit supplies the resulting voltage across the resistor to a control terminal of a sensing transistor to sense the overcurrent condition corresponding to an ON or OFF operation of the sensing transistor, then providing feedback to limit the output current by means of a current flowing what the sensing transistor is turned ON.

4. The overcurrent protection circuit according to claim 2, wherein
    the first and second sensor circuits, each connected in parallel to the voltage generator circuit, allow a current corresponding to the output current to flow through a resistor having a fixed potential at one end for conversion into a voltage, which is in turn compared with a voltage corresponding to their respective sense threshold currents to thereby sense an overcurrent condition;
    the first sensor circuit compares the voltages using a voltage comparator to thereby provide feedback to limit the output current; and
    the second sensor circuit supplies the resulting voltage across the resistor to a control terminal of a sensing transistor to sense the overcurrent condition corresponding to an ON or OFF operation of the sensing transistor, then providing feedback to limit the output current by means overcurrent flowing when the sensing transistor is turned ON.

5. A voltage generator circuit comprising:

a regulator circuit made up of an output transistor and an operational amplifier which controls the output transistor; and first and second sensor circuits, the first sensor circuit including:
- a first transistor arranged in parallel to the output transistor;
- a first resistor, provided on a current path of the first transistor, with a fixed voltage at one end; and
- an error amplifier which compares a voltage appearing at the other end of the first resistor with a voltage corresponding to a first sense threshold current to provide feedback to limit the output current to the operational amplifier when the voltage appearing across the first resistor is higher, the second sensor circuit including:
- a second transistor arranged in parallel to the output transistor;
- a second resistor, provided on a current pat of the second transistor, with a fixed voltage at one end; and
- a sensing transistor which receives at a control terminal thereof the voltage appearing at the other end of the second resistor to sense an overcurrent condition corresponding to its ON or OFF, then providing feedback to limit the output current to the operational amplifier when the overcurrent condition has been sensed, wherein the sense threshold current for the second sensor circuit is set to a higher value than the first sensor circuit.

6. An electronic apparatus comprising:

a battery; and the voltage generator circuit according to claim 5, which supplies a voltage front the battery to a load.

7. An electronic apparatus according to claim 6, further comprising a capacitor connected in parallel to the load.

8. An electronic apparatus comprising:

a battery; and the overcurrent protection circuit according to claim 1, which limits the output current from the battery to a load.

9. An electronic apparatus comprising:

a battery; end the overcurrent protection circuit according to claim 2, which limits the output current from the battery to a load.

* * * * *